United States Patent [19]
Curti

[11] 4,423,954
[45] Jan. 3, 1984

[54] DEVICE FOR EXPOSING TO LIGHT PRINTED ELECTRIC CIRCUIT SUPPORTING PLATES OR BOARDS

[76] Inventor: Ezio Curti, Viale Regina Giovanna, 38, Milano, Italy

[21] Appl. No.: 258,438

[22] Filed: Apr. 28, 1981

[30] Foreign Application Priority Data

May 7, 1980 [IT] Italy .................. 21840 A/80

[51] Int. Cl.³ .................................. G03B 27/60
[52] U.S. Cl. .................................. 355/73; 355/76
[58] Field of Search .................. 355/73, 76, 40, 53

[56] References Cited
U.S. PATENT DOCUMENTS

| 1,808,836 | 6/1931 | Caps | 355/76 |
| 3,695,760 | 10/1972 | Orr | 355/53 |
| 4,208,124 | 6/1980 | Fox | 355/73 |

*Primary Examiner*—Monroe H. Hayes

[57] ABSTRACT

A device is disclosed for exposing to light printed electric circuit supporting plates or boards, provided with supporting means effective to support the glass or other transparent rigid material sheets including the circuit paths or tracks and enclosing, as a sandwich, the supporting plate, the assembly being effective to be acted upon by a high vacuum.

16 Claims, 15 Drawing Figures

DEVICE FOR EXPOSING TO LIGHT PRINTED ELECTRIC CIRCUIT SUPPORTING PLATES OR BOARDS

The present invention relates to a device for exposing to light printed electric circuit supporting plates or boards.

BACKGROUND OF THE INVENTION

As it is known, the electric circuit supporting plates are coated, on one or both sides, with a metal layer, advantageously a copper layer, and with a photosensitive layer including a film on which is located the paths or tracks of the electric circuit.

By exposing the surface or surfaces coated by the film carrying the electric circuit path to a light source there is obtained, for example, the curing of the photosensitive layer and, by means of suitable subsequent chemical treatments, the surfaces of the photosensitive layer not exposed to light are removed from the supporting plate. The portions of the underlying metal layer are also removed, thereby providing, at the end of the treatment, a plate or board on which the desired circuit paths are formed. As aforesaid, said electric circuits may be formed either on a single or on both faces or sides of the plate.

To provide electronic circuits of very high quality and precision it is essential that the films including the circuit paths perfectly adhere to the plate provided with the metal layer as well as the photosensitive layer. Furthermore it is essential to locate the films at a precise position on the surface of the supporting plate. To this end, it is a common practice to provide the supporting plate with locating holes corresponding to locating or registering holes formed through the films and supporting members, thereby allowing for said films to be accurately located on the supporting plate, by means of registering pins and the like.

On the other hand the holes punched in the films including the circuit paths tend to enlarge with time due to the fact that said films are not rigidly supported and, accordingly, cannot provide the desired reproducibility and accuracy.

In order to cause the film to precisely adhere to the flat surface of the electric circuit supporting plate, a so-called "sandwich" pack is formed, by locating at the centre the supporting plate enclosed by two films including the electric or electronic circuit path pattern. The thus obtained pack is introduced into an envelope made of a transparent material which is then sealed and evacuated in such a way as to form a high vacuum in the inside of the envelope, which would assure a perfect adhesion of the film having the circuit pattern thereon to the corresponding side of the electric or electronic circuit supporting plate.

In addition to the fact that the use of flexible circuit pattern films creates great problems with respect to the accuracy, in particular when the electronic circuits have to be used in applications requiring high reliability and precision, it should be noted that the locating of the films on the sides of the supporting plate and the introduction of the pack thus formed into the transparent envelope are completely manual operations and, accordingly, much labor is needed to produce the multiple layer pack.

More specifically the making of a composite pack and the introduction thereof into a suitable envelope to permit generating a high vacuum are expensive operations which requires great operating time and do not fulfill the requirements of industrial production of high quality.

Also known is the fact that for high precision electronic circuits glass sheets are used instead of said flexible films, which glass sheets include the electronic circuit path pattern. Also in this case it is conventional to manually provide, outside of the light exposing device, a pack consisting of two glass sheets including the circuit path pattern and enclosing therebetween a supporting plate provided for supporting the electric circuits, which plate is also provided with metal layers and photosensitive layers, as mentioned.

In order to locate said glass sheets on the supporting plate, one of the glass sheets is provided with reference or registering pins, effective to engage with registering openings formed through the supporting plate. Said registering pins have such a length as to fit not only to the circuit central supporting plate, but also the superimposed glass sheet which is also provided with like registering openings.

The thus formed pack is usually packaged into a transparent envelope, of sealed or tight type, wherein a low vacuum is generated.

The use of the glass sheets according to the conventional method exhibits the disadvantages described for the flexible films, with the difference that, if glass sheets are used, then the vacuum generated in the inside of the transparent sealed envelope is to be of a much less value, since the use of a high vacuum would immediately crack or break the glass sheets which, as it is well known, are very sensible to flexure, expansion and point stresses.

SUMMARY OF THE INVENTION

Thus, the present invention sets out to provide a device effective to eliminate the thereinabove cited drawbacks to permit the electric or electronic circuit supporting plates or boards to be exposed to light sources by using glass sheets provided with the pattern of the electronic circuit to be transferred, to permit perfectly and reproducibly locating the glass sheet with respect to the circuit supporting plate and, furthermore, to permit a high vacuum to be used without incurring danger of cracking or breaking the glass sheets carrying the circuit pattern because of thermal expansion and mechanical stresses caused by the high vacuum.

According to one aspect of the present invention this object is achieved in that each glass sheet, including the circuit paths to be transferred on the supporting plate is locked by clamps which are supported in such a way as to be capable of oscillating or floating.

According to another aspect of the present invention it is further advantageous, to reduce the mechanical losses, to make the lower glass sheet fixed and the upper glass sheet vertically movable.

In an advantageous embodiment of the invention, the plates are gripped by clamps provided with movable locking jaws. On the opposite side of the clamps from the movable jaws, are projecting arm members, defining a C-shaped opening in which resilient means, e.g pressing springs, are provided resting on the projecting arm members. The free ends of said resilient means, facing one another, rest on a projecting rib which is rigidly mounted on a horizontally extending supporting cross-member.

In a particularly advantageous manner, in order to stabilize each said clamp, a plurality of adjoining resilient means are provided, associated with each said projecting C-shaped arm member.

The invention further provides for the use of registering or adjusting and preloading means associated with said resilient spring means.

According to an advantageous embodiment of the present invention, each said clamp comprises a fixed jaw and a movable jaw, the latter being effective to be displaced and adjusted by a screw means; furthermore each jaw is provided, on the side facing the glass sheet to be supported, with a soft protecting gasket.

Advantageously each glass sheet is supported on at least the two opposite sides by a suitable clamp.

With respect to the evacuating step, there is provided, according to the invention, that one or more through holes, effective to be coupled to an evacuating pump, are formed in the supporting cross-members.

Advantageously the evacuating pump is so designed as to be capable of generating a high vacuum of great value.

A further advantageous embodiment of the present invention provides for the use of a sealing gasket to be located between the glass sheet supporting cross-members.

Moreover, it is advantageous to connect to the horizontally extending supporting cross-members swingable supporting means, effective to support shaped metal sheets tightly resting, at the ends whereof, both on said horizontally extending supporting cross-members and on the surfaces of the glass sheets.

According to the present invention, it is further provided that said shaped metal sheets perimetrically tightly encompass the glass sheet and supporting plate pack, in such a way as to form, about said pack, a sealed perimetrical chamber in which a vacuum may be formed by means of an evacuating pump.

In order to prevent undesired bending stresses from occurring, an advantageous embodiment of the present invention provides that the end of each shaped metal sheet, facing towards the glass sheets, is effective to rest on these latter in the inside of the perimeter defined by the electronic circuit supporting plate.

To permit the shaped metal sheets to fit to the size of the glass sheets, said metal sheets are assembled in telescopic relationship.

It is further advantageous that the horizontally extending cross-members are supported by a rigid frame, in such a way to allow for the horizontally extending cross-member to be properly located and adjusted.

In order to vertically displace the frame, it is operatively coupled to pneumatic cylinders or equivalent means.

In a particularly advantageous manner, also the frames are provided with holes as well as centering pins effective to be mutually mated.

It is further advantageous to connect the horizontally extending cross-members by means of longitudinal section members, advantageously of the dovetail slotted type, and telescopically engaged.

BRIEF DESCRIPTION OF THE DRAWINGS

The device according to the present invention will be described in a more detailed way by means of an embodiment thereof, given by way of an example only and illustrated in the accompanying drawings, where:

FIGS. 1 to 7 illustrate, schematically, in perspective, the several loading and discharging steps of the electronic circuit supporting plates or boards between the glass sheets.

Figure 1:
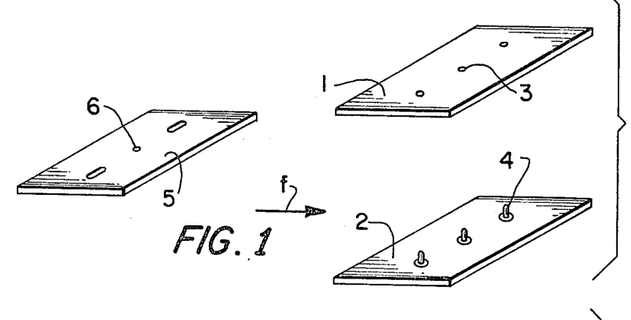
FIG. 1 schematically illustrates two spaced glass sheets and a supporting plate or board, during the supplying or feed step.

As shown in FIG. 1, at the start of the operating cycle, the glass sheets 1 and 2 are spaced apart from each other. The upper glass sheet 1 is provided with registering holes 3, effective to be coupled to mating registering pins 4 which project from the lower glass sheet 2. The positions and the arrangement of the holes 3 and the registering pins 4 can be freely selected. The electronic circuit supporting plate 5, which in FIG. 1 is in the rest position, is also provided with two registering holes 6 effective to be coupled to the pins 4.

Figure 2:
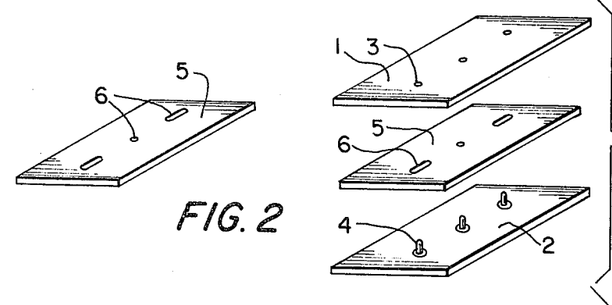
FIG. 2 illustrates the two spaced plates, with the supporting plate interposed therebetween, and with a further plate being in a rest position.

By causing the supporting plate 5 to advance in the direction shown in FIG. 1 by the arrow f, for example by means of a constant pitch sucker conveyor, the supporting plate 5 is positioned between the glass sheets 1,2 while another supporting plate 5 is located in its rest position, or waiting position, as illustrated in FIG. 2.

Figure 3:
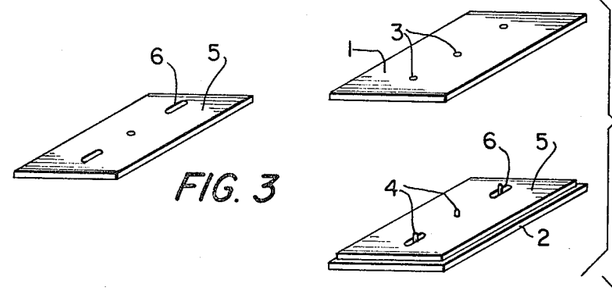
FIG. 3 illustrates the supporting plate, located with its reference or registering holes on the pin projecting from the lower glass sheet.

In FIG. 3 it should be noted that the supporting plate 5 has been already located on the fixed lower glass sheet 2 with the pins 4 inserted into the holes 6.

Figure 4:
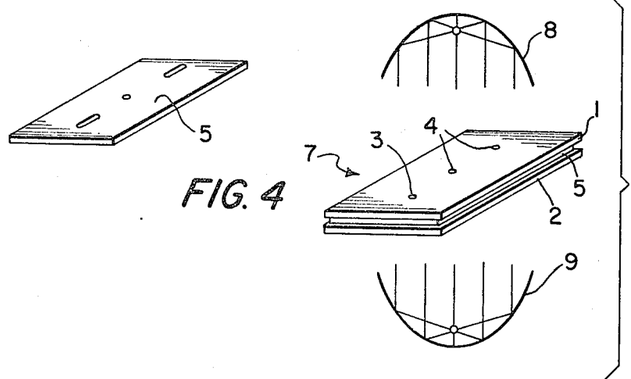
FIG. 4 illustrates the supporting plate forming, with the glass sheets, a pack ready to be exposed to two light sources.

In FIG. 4 it is possible to see that also the glass sheet 1 has been located, by the reference or registering holes and pins 3 and 4, on the supporting plate 5, thereby forming a sandwich pack generally indicated at 7. Above and below the pack are two light sources, indicated at 8 and 9, which operate to illuminate plates 1 and 2 and expose to light the photosensitive layers provided on the two sides of the supporting plate 5.

Figure 5:
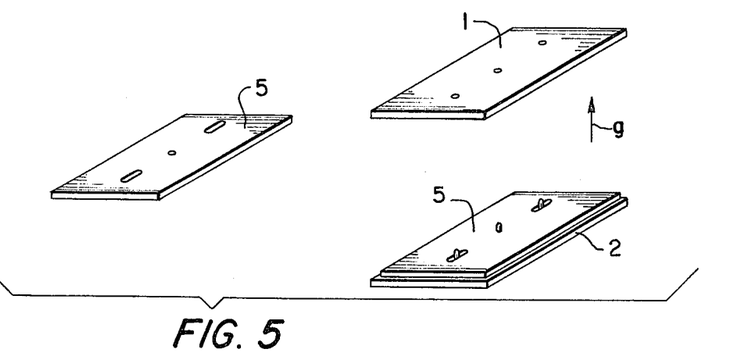
FIG. 5 illustrates a sandwich type of pack, with the upper glass sheet in an elevated condition, after the light exposing step.
Figure 6:
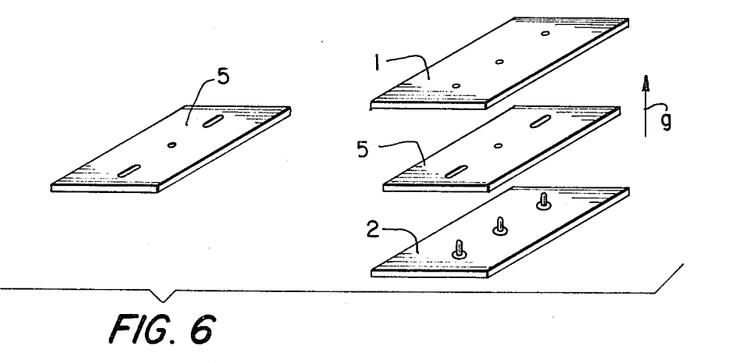
FIG. 6 illustrates the supporting plate, after the light exposing step separated from the lower glass sheet.
Figure 7:
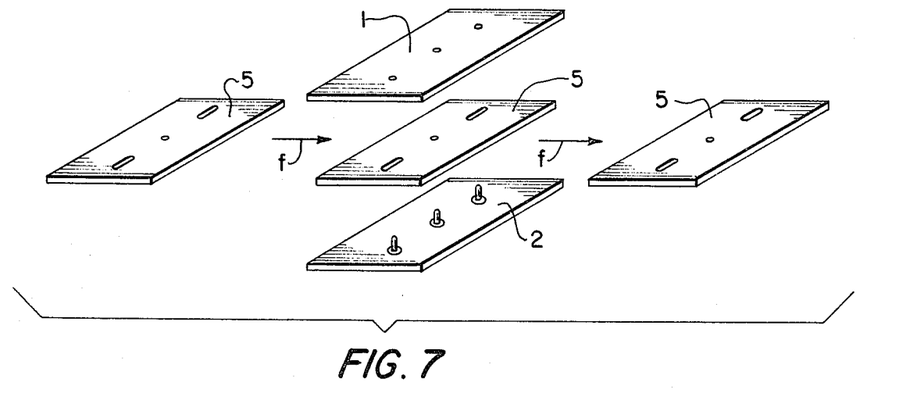
FIG. 7 illustrates the plate, exposed to the light, removed from the gap, formed between the two glass sheets which has been occupied by the following supporting plate.

After the exposure to light, as shown in FIG. 5, the upwardly movable upper glass sheet 1 is lifted in the direction indicated by the arrow g; then, as schematically shown in FIG. 6, the plate 5 is removed from the fixed lower glass sheet 2 and finally, as shown in FIG. 7, the supporting plate 5 is removed in the flow direction indicated by the arrow f. The supporting plate, previously located in its waiting or rest position, is now introduced between the glass sheets 1 and 2, which are again spaced apart, and the waiting position is occupied by a new supporting plate.

The operating cycle schematically described with reference to FIGS. 1 to 7, once started, repeats in a continuous manner.

While the loading and discharging of the electronic circuit supporting plates 5 can be carried out, for example, by means on a sucker conveyor with a constant pitch and preadjusted stroke, in order to constantly bring the plates to the same position, it has not previously been possible to provide means effective to automatically form, i.e without any manual operations, a sandwich pack 7 comprising two glass sheets 1,2 located on the sides of the electronic circuit supporting plate 5.

This gap stems from the fact that it is necessary to create a rather high counterpressure between the surfaces of the contacting glass sheets and supporting plate, that is between the sides of the supporting plate 5 and the corresponding sides of the glass sheets 1 and 2.

Prior efforts to automate, have been quickly abandoned because of the high waste due to the breaking of the glass sheets which are stressed not only by the counterpressure between the contacting sides but also by thermal expansion occurring during the exposure to light and which could not be compensated for and, finally, by a non-perfect parallelism of the two copper surfaces.

Such automation is made possible by the device designed according to the present invention, which is effective to eliminate the drawbacks of the prior art.

Figure 8:
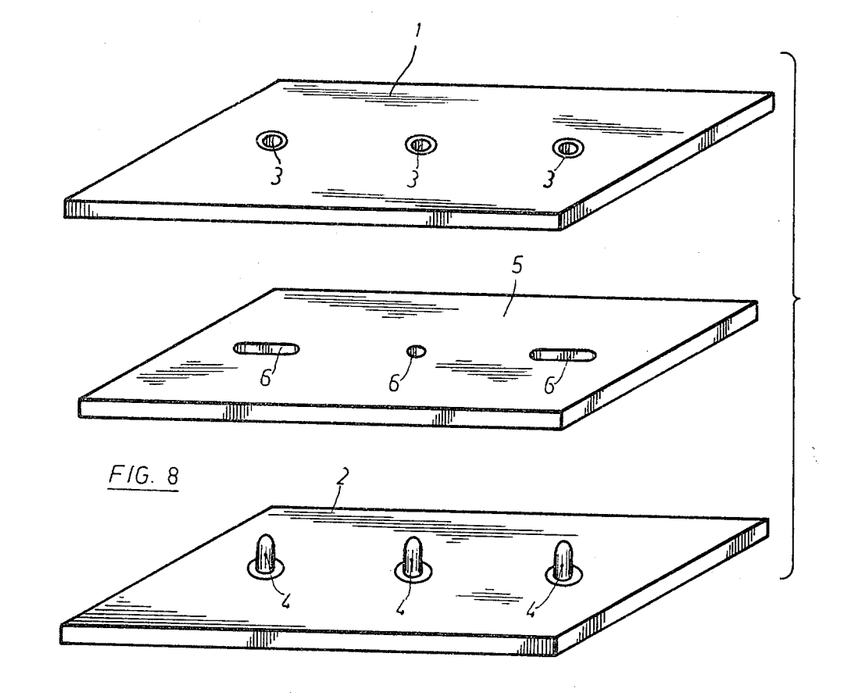
FIG. 8 illustrates, by a perspective view on an enlarged scale, the two glass sheets, provided with electronic circuit path patterns, and the supporting plate, provided with the metal and photosensitive layers.

FIG. 8 shows, at an enlarged scale again, the two glass sheets 1 and 2, as well as the intermediate electronic circuit supporting plate or board 5.

The lower glass sheet 2, which is a fixed one, is provided with registering pins 4, projecting upwardly and provided at their lower ends with enlargements 4a with which the pins 4 are, for example, glued into suitable holes formed in the fixed lower glass sheet 2.

The locations of the pins 4 are selected in any convenient fashion and depend essentially on the track pattern of the electronic circuit. The length of the registering pins 4 is advantageously selected slightly less than the sum of the thicknesses of the supporting plate 5 and the upper movable glass sheet 1.

Through the supporting plate 5, as mentioned, there are formed, at the pins 4, registering and locating holes 6, some of which may be slot shaped, in order not to interfere with the movement resulting from thermal expansion. The upper glass sheet 1 is provided with registering and locating holes 3, also formed at the pins 4 and, advantageously said holes 3 are formed through bushings 3a, made of a material resistant against wear and glued in the upper glass sheet 1.

Figure 9:
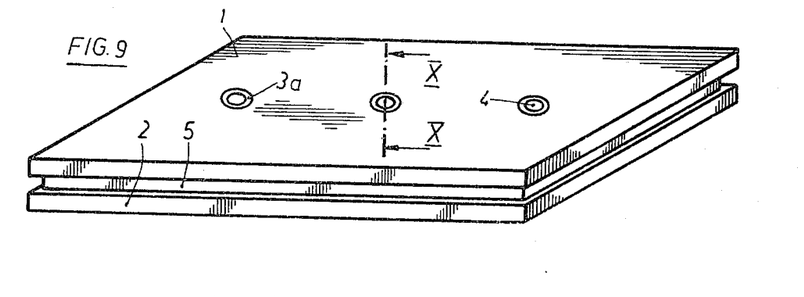
FIG. 9 illustrates, on an enlarged scale, the glass sheets and the plates of FIG. 8, arranged in such a way as to form a sandwich pack.

In FIG. 9 it can be seen that the perimetrical lengths, as well as the lateral dimensions, of the glass sheets 1 and 2 are greater than the perimetrical length and lateral dimensions of the electronic circuit supporting plate 5, in such a way that the glass sheets 1 and 2 project cantilever-wise along all the perimeter of the central supporting plate 5.

Figure 10:
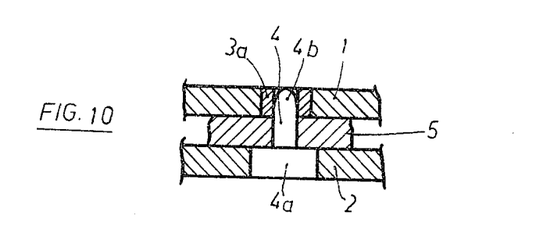
FIG. 10 illustrates, by a cross-section taken along the line X—X of FIG. 9 a detail of a reference or registering pin, going through the supporting plate and engaging with a reference or registering hole formed on the superimposed glass sheet.

From FIG. 10, which illustrates a detail in cross-section, as taken along the line X—X of FIG. 9, it is possible to see the enlargement 4a, glued into the glass sheet 2, from which the pin 4 extends upwardly through plates 5 and 1. The top of each pin is formed as a point or a cone 4b in order to facilitate the insertion into the hole 6 of the supporting plate 5, as well as the insertion into the hole 3 of the sleeve 3a, fixed in the upper movable glass sheet 1.

To expose to the light the pack 7, consisting of the movable glass sheet 1, provided with registering holes 3, the supporting plate or board 5, provided with registering holes 6, and of the lower fixed glass sheet 2, provided with the registering pins 4, the pack 7 is formed as it is schematically illustrated in FIGS. 1 to 7.

Figure 11:
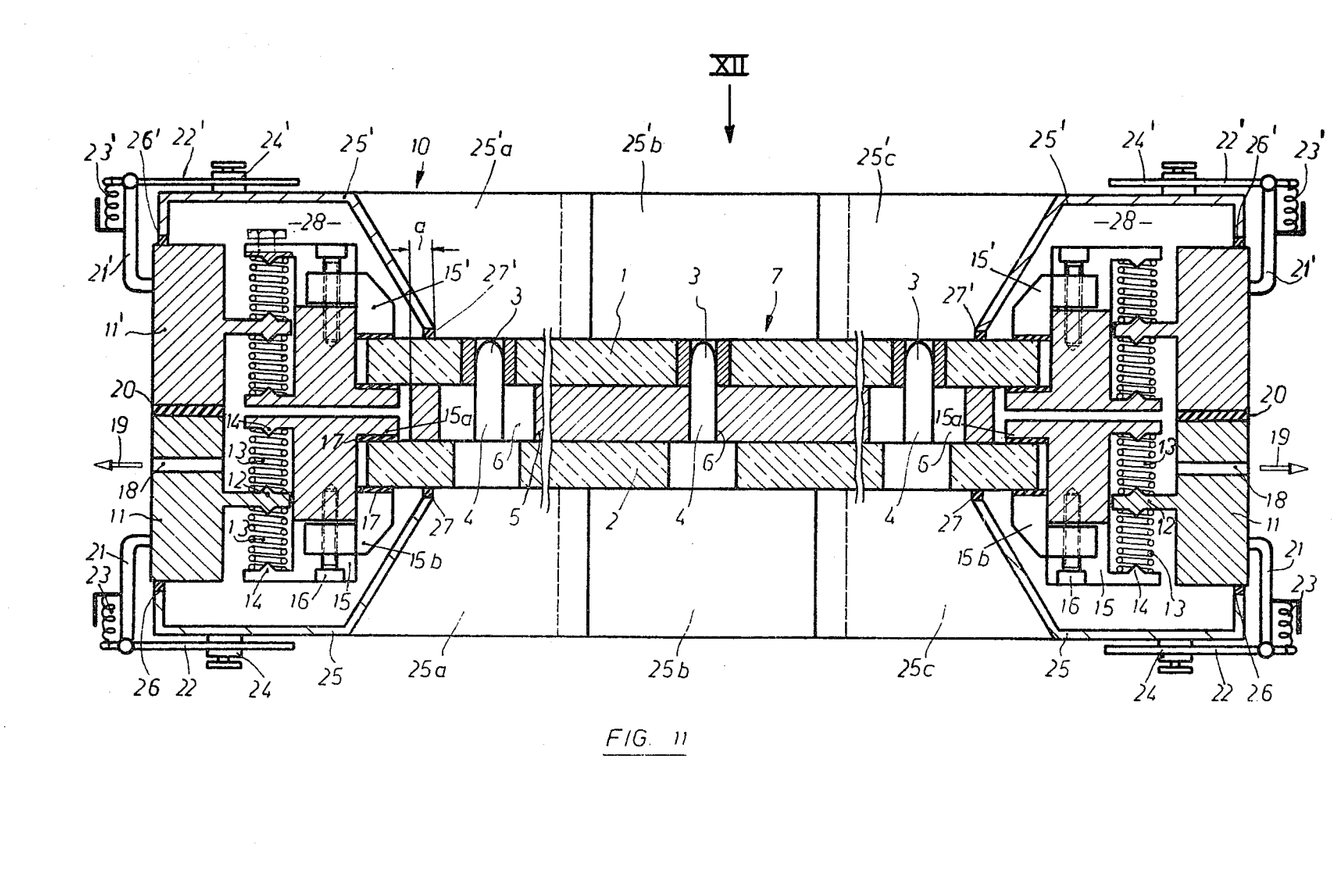
FIG. 11 illustrates, by a cross-section taken along the line XI—XI of FIG. 12 the device according to the present invention.
Figure 12:
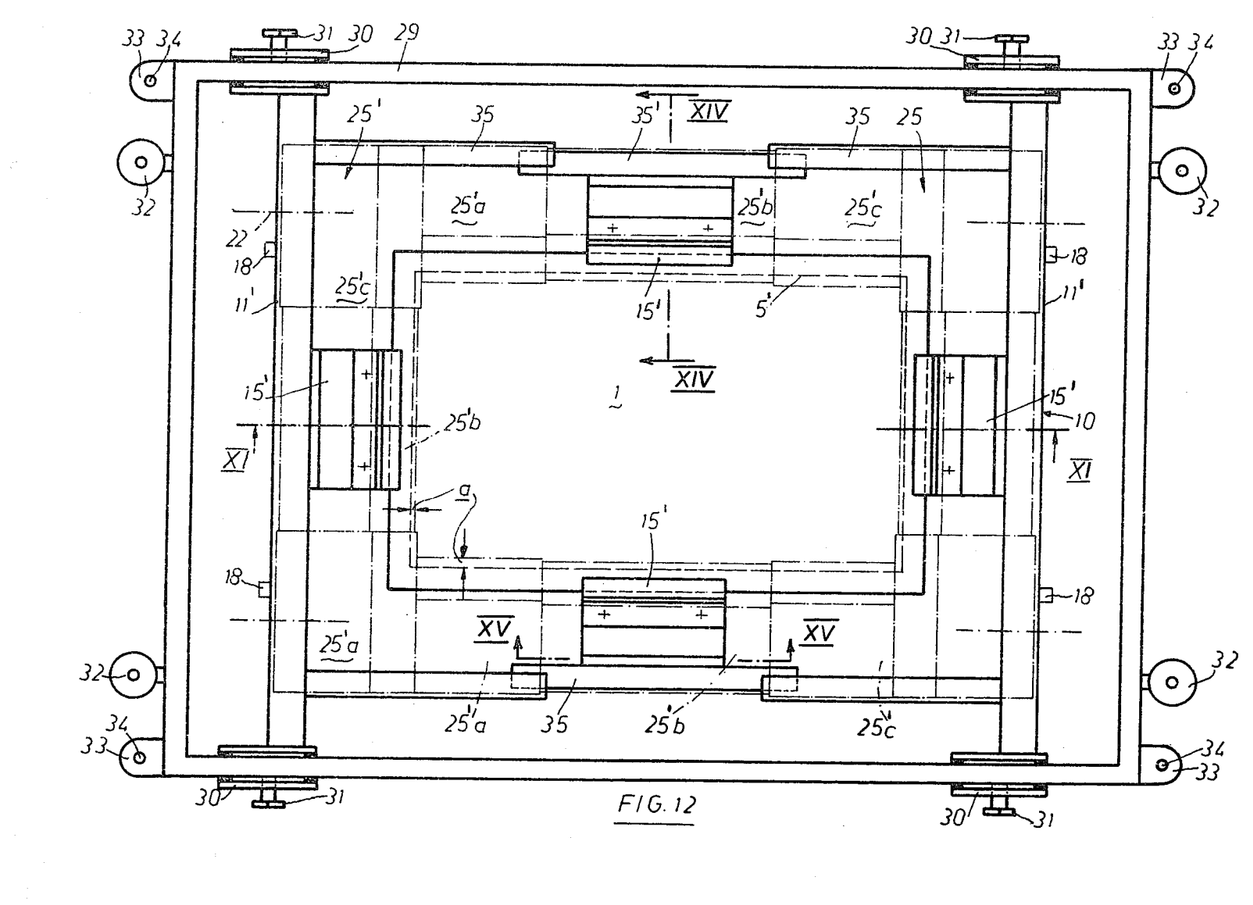
FIG. 12 illustrates the device according to the present invention, by a plan view, according to the arrow XII of FIG. 11.

To this end, the device is used indicated generally at 10 and illustrated in FIG. 11 by a cross-section taken along the line XI—XI of FIG. 12.

Said device 10 comprises parallel lower cross-members 11, from the inside of which a rib 12 projects, forming a flange or shelf to support resilient means, such as a compression coil springs 13, advantageously preloaded and resting with the other end on projecting arm members 14 of a clamp 15, the side of which facing the corresponding cross-member 11 is of C-shape.

Each clamp 15 comprises a fixed jaw 15a and a movable jaw 15b which is movable relative to fixed jaw 15a, the relative spacing therebetween being adjustable to be displaced and by means of a screw 16. The glass sheet 2 is locked by means of the clamps 15 at the two opposite sides and, if it is desired, said glass sheet 2 can be locked also on the four perimetrical sides by means of suitable clamps 15. Advantageously the portions 15a,15b of the clamps 15 are provided, on those surfaces which face and engage the adjacent faces of glass sheet 2, with protecting gaskets 17 made of a soft and resilient material, such as rubber or a synthetic suitable material. The cross-members 11 are further provided with a through hole 18, coupled to an evacuating pump 19, provided for creating a high vacuum.

Also the movable glass sheet 1 is supported by clamps 15', connected in the manner described in connection with sheet 2 and clamps 15 using further parallel cross-members 11'.

All the supporting means for the upper glass sheet 1 correspond to the above described supporting means for the fixed lower glass sheet 2 and accordingly these structural elements are indicated by the same reference numbers with the addition of (') and they will be not described in any further details.

Between the cross-members 11 and 11' there is provided a gasket 20 which seals the junction zone between the parallel cross-members 11 and 11'. To each cross-member 11 and 11' there is connected one of supporting arm members 21,21' each of which supports a swingable lever 22, 22', of rocker shape, the shorter portion of which is biased by a spring means 23,23'. The longer portion of each arm member supports an adjusting sleeve 24,24' which is slidably mounted on its associated arm and which is connected to a shaped metal sheet 25,25'. Each shaped sheet 25,25' has along its distal outer edge a gasket forming sealing means 26,26', which tightly rests on the cross-member 11,11' and also has along its distal inner edge which rests sealing means 27,27' on the glass sheets 1,2 in such a way as to form a sealed chamber 28 which perimetrically surrounds the overall sandwich pack 7, formed by the glass sheets 1,2 and the electronic circuit supporting plate 5.

According to the present invention it is very important that the resting line 27,27' of the shaped metal sheet on the glass sheets 1,2 is provided inwardly of the outer the perimeter of the supporting plate or board 5, thereby preventing, during the vacuum generating step within the chambers 28, any bending movement from occurring at the ends of the cantilever-wise projecting edge portions of glass sheets 1 and 2. Edges 27,27' are preferably formed so that the contact lines are spaced inwardly a significant distance (a), shown in FIG. 11.

The shaped metal sheets 25 and 25' encompass the pack 7, including the glass sheets 1,2 and the supporting plate 5, perimetrically and, obviously, the perpendicular junctions between the shaped or contoured plates 25,25' located along the perimeter of the pack 7 and formed as single pieces, 25a,25b,25c and 25'a,25'b, 25'c are of telescopic design and made tight by the interposition of known sealing means, not shown.

In FIG. 12, which illustrates a plan view of the device 10 shown in FIG. 11, it should be noted that the cross members 11' are slidingly supported by a rectangular frame 29, supporting the cross-members 11' by means of sliding sleeves 30 effective to be located depending on the size of the glass sheet 1 and locked by means of a locking screw 31 or the like. It should be evident that also for the lower cross-members 11 it is necessary to provide a frame indentical to the frame 29. The lower frame (not shown) supporting the lower cross-members 11 is identical to the upper frame 29, with the sole difference that the lower frame (not shown) is a fixed one, while the upper frame 29 (FIG. 12) is a movable one, i.e., it is capable of being displaced either upwardly or downwardly with respect to the horizontal plane.

For the purpose of accomplishing this vertical adjustment, the apparatus can be provided with pneumatic cylinders 32 or equivalent driving means. In order to center the upper frame 29, movable with respect to the lower fixed frame, upper frame 29 is provided with projections 33, provided with centering holes 34, effective to engage with like projections rigid with the fixed lower frame and provided with centering pins (not shown) effective to be coupled with the centering holes 34.

The cross-members 11', supporting the clamps 15', are further connected, on two opposite sides, by longitudinal parallel section members 35, advantageously of the telescopically engaged type, in order to provide easy fitting to the length of the used glass sheet.

It may be advantageous to also provide the section members 35 with clamps 15'; however this is to be considered an optional solution, since the desired results can be obtained by the mere provision and particular arrangement of the locking clamps 15', as supported by the cross-members 11'.

With the cross-members 11' there are associated shaped metal sheets 25', formed in individual, separate portions or lengths 25a', 25b', 25c' and assembled telescopically in order to properly locate and fit the sealing shaped metal sheets 25'(25) to the glass sheets 1, 2 employed to form the pack and to adapt the size thereof to the size of sheet selected. The shaped metal sheets 25 encompass perimetrically the glass sheet 1 so that they overlap perpendicularly at the corners. In this manner, by using known sealing means, it is possible to encompass in a prefectly tight manner the glass sheet 1, 2, thereby providing a sealed chamber 28 about the pack 7.

From FIG. 12 it is possible to also note that the inner ends of the tight metal sheets 25' rest on the glass sheet 1 in the inside of the perimeter 5' of the plate or board 5 to be exposed to light, thereby safely preventing bending stresses from occurring during the evacuating step of the chamber 28, confined by the sealing sheets 25', which bending stresses could be transmitted, during said evacuating step, from the metal sheet 25 to the glass sheet 1 and cause said glass sheet 1 to immediately break or crack.

It should be obvious that all of the structural members, as described and illustrated in FIG. 12, are also provided for the fixed lower frame (not shown) with that same arrangement (mirrorly opposite) and that same function. Thus, the latter structural elements will be not described in any further details.

Figure 13:
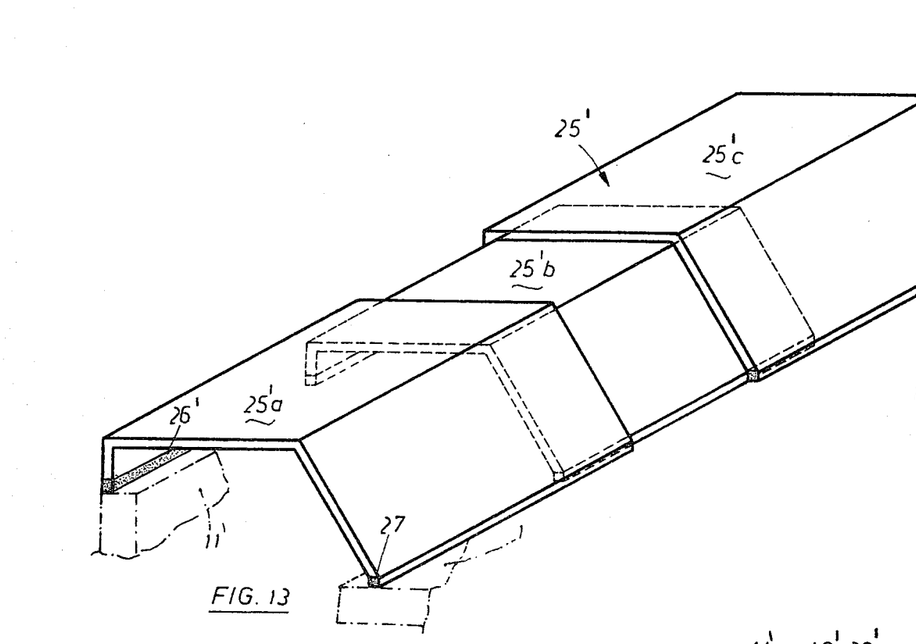
FIG. 13 illustrates, by a perspective view, a detail of the perimetrical section members, used for forming a sealed or tight gap or recess.

From FIG. 13 it is possible to see a detail illustrating the telescopically coupled sections forming metal sheet 25'. Metal sheets 25'a,25'b,25'c are elbow bent and the ends thereof are provided with sealing means 26' and 27'. The sealing means 26' rests on the cross-member 11', whereas the sealing means 27' rests, in the described manner, on the surface of the upper movable glass sheet 1.

Obviously, also between the individual elements 25'a,25'b and 25'c there are provided known sealing means which are not described in any further detail.

Also the shaped metal sheets 25, associated with the fixed lower cross-members 11 are constructed in the same way (FIG. 11).

Figure 14:
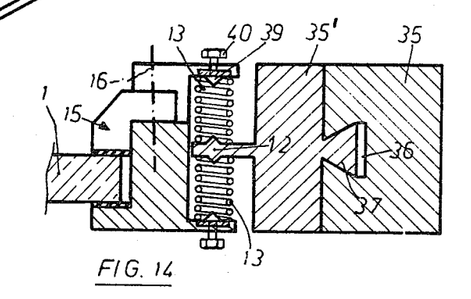
FIG. 14 illustrates a detail in cross-section, taken along the line XIV—XIV of FIG. 12, illustrating a portion of the clamp, as well as a portion of the telescoping supporting frame.

FIG. 14 illustrates a cross-section, taken along the line XIV—XIV of FIG. 12.

FIG. 14 shows a practical embodiment of the telescopic section including members 35,35'. As shown, the section members 35 are provided with a dovetail slot 36 effective to fit, in a movable manner, the section member 35' provided with a dovetail shaped projection 37. By this coupling 36,37 between the sections 35,35' relative longitudinal displacement between the members is permitted as the cross-members 11' are translated with the slidable sleeves 30. Accordingly, it is a simple matter to obtain a precise fitting to the size of the glass sheets 1. By means of the projecting rib 12', the section member 35' supports, with the interposition of the aforesaid spring means 13', the clamp 15' effective to support the upper glass sheet 1, including the circuit path pattern, to be transferred by a photographic process on the supporting plate or board 5.

Figure 15:
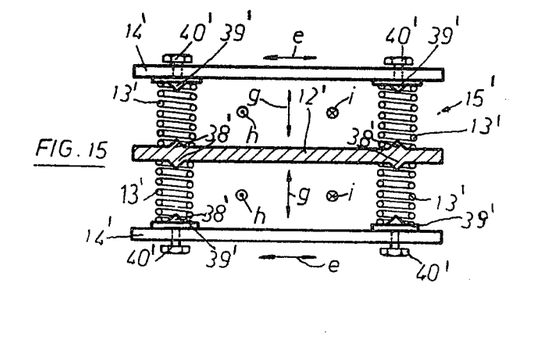
FIG. 15 illustrates a detail of the means supporting the clamp, shown in cross-section as taken according to the line XV—XV of FIG. 12.

FIG. 15 illustrates, by a cross-section taken along the line XV—XV of FIG. 12, the floating supporting for the clamp 15'.

As it is possible to see from this figure, for each clamp two spring or resilient means 13' are provided, located on both sides of the supporting rib 12'. Preferably, the supporting rib 12' is provided with locating ridges 38' which protrudes into one end of the corresponding spring means 13'. It is further advantageous to provide, at the arm members 14', further locating projections 39', in the form of movable small plates, which are operatively coupled to screws 40', screwed in the arm members 14' to permit the degree of compression of spring means 13' to be adjusted to to establish a predetermined preload in said spring means 13'.

Owing to the particular "floating" or oscillating support of the clamps 15, these latter can be freely displaced in the horizontal direction (arrow e), in the vertical direction (arrow g) and perpendicularly with respect to the drawing plane (arrows h and i of FIG. 15).

The device operates as follows: the movable upper glass sheet 1 is originally spaced from the lower fixed glass sheet 2 by means of the cylinders 32, operatively coupled to the upper movable frame 29, supporting the glass sheet by means of the cross-members 11'. This condition is schematically illustrated in FIG. 1. Then, between the spaced glass sheets 1 and 2 there is introduced, by means of a sucker feeder, the supporting plate or board 5, located on the lower glass sheet 2, as it is illustrated on FIGS. 2 and 3. Finally, by means of the cylinders 32, the glass sheet 1 is located on the supporting plate 5, thereby forming, by using the registering or adjusting pins and openings 4 and 3, a sandwich pack, generally indicated at 7 and schematically illustrated in FIGS. 4,9 and 10.

Before exposing to light the thus formed sandwich 7, said light being emitted by the light sources 8 and 9 (FIG. 4), a vacuum is formed within the chamber 28 and, accordingly, between those surfaces of the glass sheets 1 and 2 which contact adjacent the surfaces of the interposed supporting plate 5, the vacuum being provided through the passages 18 provided in the lower cross-members and coupled to a suitable evacuating pump 19.

Only after the desired vacuum in the chamber 28 and accordingly between the contacting surfaces of the glass sheets 1 and 2 and the supporting plate 5 has been generated there is carried out the exposure to light, by means of the light sources 8 and 9.

Owing to the particular floating supporting of the glass sheets and to the particular locating and arrangement of the shaped metal sheets 25,25' it is possible to use, in a new and surprising manner, an extremely high vacuum, without subjecting the glass sheets 1 to any breaking dangers. Furthermore, owing to the aforesaid floating supporting, by means of the clamps 15,15', the glass sheets 1 and 2 are capable of carrying out an adaptive movement in the case of possible expansions and, moreover, the cantilever-wise projecting ends of the glass sheets 1 and 2 are not subjected to any bending stresses, said ends being subjected simply to pressing forces which are evenly distributed along the perimeter of the glass sheets 1 and 2.

Accordingly, by means of the device 10 according to the present invention it is possible, for the first time, to light expose electronic circuit supporting plates or boards 5, by means of glass sheets 1 and 2, in such a way as to use a high vacuum, thereby providing, without any labour or manual operations, automatically produced electronic circuits of high quality and accuracy.

I claim:

1. An improved apparatus for exposing desired regions of a layer photosensitive material as determined by a pattern for a circuit comprising the combination of
   a plate pack including
   first and second substantially rigid glass plates;
   means on at least one of said plates defining a circuit pattern;
   a support member including a substantially rigid support plate;
   a layer of photosensitive material carried by said support plate adjacent said at least one glass plate on which said pattern exists;
   first clamp means for firmly gripping said first glass plate;
   second clamp means for firmly gripping said second glass plate;
   means for supporting said first and second clamp means to permit relative movement therebetween, said clamp means being supported thereby such that said glass plates are in generally parallel relationship with said support plate therebetween; and
   means defining a vacuum chamber surrounding the periphery of said plate pack,
   said chamber having edge portions in sealing engagement with marginal portions of the outwardly facing surfaces of said glass plates so that the pattern area of said at least one glass plate is unobscured and so that the chamber interior is in communication with the spaces between said plates; and
   means for drawing a high vacuum in said chamber and said spaces, whereby said pattern and photosensitive material can be exposed to light while a vacuum is drawn to hold the plates tightly together without danger of damaging said glass plates.

2. An apparatus according to claim 1 wherein said means for supporting said clamp means includes
   means for moving one of said clamp means away from the other;
   and wherein said plates include
   a plurality of pins carried by one of said glass plates and extending toward the other, and
   means defining openings in the other glass plate positioned and dimensioned to receive said pins for positioning said plates relative to each other.

3. An apparatus according to claim 2 wherein one of said clamp means and its associated plate is fixed in a horizontal position and the other is vertically movable.

4. An apparatus according to claim 1 wherein each of said clamp means includes
   a pair of relatively movable locking jaws extending toward and engaging an edge of its associates glass plate;
   a substantially rigid arm member protruding away from each of said jaws in a direction such that the arm members associated with each pair of jaws defines a generally C-shaped opening;
   and wherein said means for supporting said clamp means includes
   a rib extending into each said C-shaped opening; and
   resilient means extending between said rib and each of said arms for supporting said arms and said jaws such that said clamp means is movable relative to said rib.

5. An apparatus according to claim 4 wherein each said arm member includes centering means for properly positioning said resilient means, and means for placing said resilient means under a preload.

6. An apparatus according to claim 4 wherein said pair of jaws includes a fixed jaw;

a movable jaw;

screw means for positioning and coupling said jaws to each other and for adjusting the spacing thereof; and a soft, protective gasket on the glass-contacting surface of each jaw.

7. An apparatus according to claim 1 wherein each of said first and second clamp means includes a plurality of pairs of clamping jaws, at least one being located on at least two opposite sides of the associated glass plate.

8. An apparatus according to claim 4 wherein said means defining a vacuum chamber includes a plurality of supporting cross members extending in parallel relationship with at least two sides of said pack, and wherein said means for drawing a vacuum includes a passage through at least one of said cross member connectable to a high-vacuum pump.

9. An apparatus according to claim 8 wherein each of said cross members includes an upper portion fixedly attached to a rib operatively associated with the clamp members gripping the upper glass plate, a lower portion fixedly attached to a rib operatively associated with the clamp means gripping the lower glass plate, and a sealing gasket between said upper and lower portions.

10. An apparatus according to claim 9 wherein said means defining a vacuum chamber includes a plurality of upper and lower shells each extending between one of said cross members and a marginal portion of one of said glass plates, each of said shells including a plurality of telescopically assembled, open-sided shell sections, and sealing means between adjacent, overlapping ones of said sections to permit variation of the length of the assembled sections, while maintaining a vacuum.

11. An apparatus according to claim 10 and further comprising a rectangular support frame external of said support members;

means for supporting first and second parallel cross members in sliding relationship along opposite sides of said frame;

the remaining ones of said cross members being supported between said first and second members.

12. An apparatus according to claim 11 wherein said support plate has smaller lateral dimensions than said glass plates, and wherein said shells contact said glass plates inwardly of the edges thereof so as to be within the perimeter of said support plate.

13. An apparatus according to claim 11 wherein said means for supporting said cross members includes a sliding sleeve at each end of each cross member slidably mounted on said frame, and a locking screw on each sleeve for fixing the position of said sleeve.

14. An apparatus according to claim 8 and further comprising a first rectangular rigid support frame external of the upper portions of said cross members;

a second rectangular rigid support frame external of the lower portions of said cross members; and means for slidably supporting said upper portions on said first frame and said lower portions on said second frame;

and wherein said means for moving one of said clamp means away from the other includes driving means interconnecting said first and second frames for moving said first frame with its associated cross members and said first glass plate relative to said second frame.

15. An apparatus accordingly to claim 14 wherein one of said frames includes guide pins and the other frame includes guide holes adapted to receive said pins to align said frames.

16. An apparatus according to claim 8 and including a plurality of interconnected longitudinal members extending between parallel ones of said cross members, said longitudinal members having means defining dovetail ribs and slots to permit lengthwise adjustment thereof.

* * * * *